(12) United States Patent
Lee et al.

(10) Patent No.: US 12,085,450 B2
(45) Date of Patent: Sep. 10, 2024

(54) DEPOSITION APPARATUS AND METHOD FOR INSPECTING NOZZLE USING THE SAME

(71) Applicant: Samsung Display Co., Ltd., Yongin-si (KR)

(72) Inventors: Su Hwan Lee, Asan-si (KR); Young Bae Kee, Cheonan-si (KR); Min Woo Kim, Asan-si (KR); Un Cheol Sung, Cheonan-si (KR); Byoung Gu An, Asan-si (KR); Jae Soo Ha, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 951 days.

(21) Appl. No.: 17/111,258

(22) Filed: Dec. 3, 2020

(65) Prior Publication Data

US 2021/0278280 A1    Sep. 9, 2021

(30) Foreign Application Priority Data

Mar. 5, 2020 (KR) .................... 10-2020-0027630

(51) Int. Cl.
| | |
|---|---|
| *G01J 5/00* | (2022.01) |
| *B05B 15/52* | (2018.01) |
| *G01J 5/52* | (2022.01) |
| *G01J 5/60* | (2006.01) |

(52) U.S. Cl.
CPC ............ *G01J 5/0037* (2013.01); *B05B 15/52* (2018.02); *G01J 5/52* (2013.01); *G01J 5/60* (2013.01); *G01J 2005/0077* (2013.01)

(58) Field of Classification Search
CPC .... G01J 5/0037; G01J 5/52; G01J 5/60; G01J 2005/0077; B05B 15/52
See application file for complete search history.

(56) References Cited

U.S. PATENT DOCUMENTS

| | | | |
|---|---|---|---|
| 7,484,885 B1 * | 2/2009 | Carlson | H04N 23/633 356/43 |
| 2018/0019395 A1 * | 1/2018 | Park | H10K 71/164 |
| 2018/0027190 A1 * | 1/2018 | Srinivasan | G01N 25/72 348/164 |

FOREIGN PATENT DOCUMENTS

| | | |
|---|---|---|
| KR | 10-2013-0028821 A | 3/2013 |
| KR | 10-2018-0007387 A | 1/2018 |
| KR | 10-1941408 B1 | 1/2019 |
| KR | 2019132888 A * | 11/2019 ....... H01L 21/02631 |

OTHER PUBLICATIONS

Espacenet English Machine Translation of KR20190132888. (Year: 2019).*

* cited by examiner

*Primary Examiner* — Christine T Mui
*Assistant Examiner* — Kathryn Elizabeth Limbaugh
(74) *Attorney, Agent, or Firm* — Lewis Roca Rothgerber Christie LLP

(57) ABSTRACT

A method for inspecting a nozzle includes: measuring a temperature of the nozzle; comparing the temperature of the nozzle with a reference temperature; and determining whether or not the nozzle is clogged based on the temperature of the nozzle.

20 Claims, 14 Drawing Sheets

DEPOSITION APPARATUS AND METHOD FOR INSPECTING NOZZLE USING THE SAME

CROSS-REFERENCE TO RELATED APPLICATION

The present application claims priority to and the benefit of Korean Patent Application No. 10-2020-0027630 filed on Mar. 5, 2020 in the Korean Intellectual Property Office, the content of which is incorporated herein by reference in its entirety.

BACKGROUND

1. Field

Aspects of some example embodiments of the present invention relate to a deposition apparatus and a method for inspecting a nozzle using the same.

2. Description of the Related Art

An organic light emitting display device is a display device in which electrons injected from a cathode and holes injected from an anode recombine to an organic thin film to form an exciton, and the phenomenon in which light of a specific wavelength is generated by energy from the formed exciton is used.

A vacuum deposition method may be used as a method for depositing an organic substance or a metal used as an electrode in the organic light emitting display device. The vacuum deposition method may include the following operations: a substrate on which an organic thin film is to be formed is placed inside a vacuum chamber; a deposition mask having the same pattern as a thin film to be formed is adhered; and then a deposition material such as an organic material is evaporated or sublimated using a deposition source unit to deposit it on the substrate.

The above information disclosed in this Background section is only for enhancement of understanding of the background and therefore the information discussed in this Background section does not necessarily constitute prior art.

SUMMARY

Aspects of some example embodiments of the present invention include a deposition apparatus including a nozzle inspection unit capable of inspecting whether or not a nozzle is clogged by measuring a temperature of the nozzle unit, and a method for inspecting whether or not the nozzle is clogged using the same.

Aspects of some example embodiments of the present invention may further include a deposition apparatus that may remove clogging of a nozzle by selectively irradiating laser to the nozzle where nozzle clogging has occurred.

However, aspects of embodiments according to the present invention are not restricted to those set forth herein. The above and other aspects of the present invention will become more apparent to one of ordinary skill in the art to which the present invention pertains by referencing the detailed description of the present invention given below.

A method for inspecting a nozzle according to some example embodiments includes measuring a temperature of the nozzle, and comparing the temperature of the nozzle with a reference temperature to determine whether or not the nozzle is clogged.

According to some example embodiments, the method for inspecting includes removing nozzle clogging of the nozzle when it is determined that the nozzle is clogged.

According to some example embodiments, in removing the nozzle clogging, a laser beam is irradiated to the nozzle using a laser.

According to some example embodiments, determining whether or not the nozzle is clogged further comprises determining that the nozzle is not clogged when the temperature of the nozzle is not below the reference temperature.

According to some example embodiments, a method for inspecting a nozzle includes photographing a nozzle by a thermal imaging camera to generate thermal image data including temperature information of the nozzle, and determining whether or not the nozzle is clogged based on the thermal image data.

According to some example embodiments, determining whether or not the nozzle is clogged comprises comparing a color representing the nozzle from the thermal image data and a color representing a reference temperature.

According to some example embodiments, determining whether or not the nozzle is clogged further comprises determining that the nozzle is clogged when the color representing the nozzle is a color representing a temperature below the reference temperature.

According to some example embodiments, determining whether or not the nozzle is clogged includes calculating a temperature of the nozzle from the thermal image data; and comparing the calculated temperature of the nozzle and a reference temperature.

According to some example embodiments, determining whether or not the nozzle is clogged further comprises determining that the nozzle is clogged when the calculated temperature of the nozzle is below the reference temperature.

According to some example embodiments, removing nozzle clogging of the nozzle when it is determined that the nozzle is clogged.

According to some example embodiments according to the present disclosure, a deposition apparatus includes a deposition source including at least one nozzle arranged along a direction, a temperature measurement unit for measuring a temperature of the nozzle, and a determination unit for determining whether or not the nozzle is clogged based on measurement data of the temperature measurement unit.

According to some example embodiments, the temperature measurement unit comprises a thermal imaging camera for photographing the nozzle to generate thermal image data, wherein the thermal imaging camera is arranged to be spaced apart from the nozzle.

According to some example embodiments, the determination unit calculates the temperature of the nozzle from the thermal image data, and compares the calculated temperature of the nozzle with a reference temperature to determine whether or not the nozzle is clogged.

According to some example embodiments, when the calculated temperature of the nozzle is below the reference temperature, the determination unit determines that the nozzle is clogged.

According to some example embodiments, the determination unit calculates a color representing the nozzle from the thermal image data, and compares a color representing the nozzle with a color representing the reference temperature to determine whether or not the nozzle is clogged.

According to some example embodiments, when the color representing the nozzle is a color representing a temperature below the reference temperature, the determination unit determines that the nozzle is clogged.

According to some example embodiments, the apparatus includes a repair unit including a laser arranged to be spaced apart from the nozzle, and a repair controller electrically connected to the repair unit to apply a control signal when it is determined that the nozzle is clogged.

According to some example embodiments, the temperature measurement unit further comprises a protective cap arranged between the thermal imaging camera and the deposition source.

According to some example embodiments, a mask assembly arranged above the deposition source and including a penetration portion and a mask.

Other example characteristics of example embodiments are included in the detailed description and drawings.

In a method for inspecting whether or not a nozzle is clogged using a deposition apparatus according to some example embodiments of the present invention, it may be possible to determine whether or not the nozzle is clogged by measuring a temperature of a nozzle unit using a thermal imaging camera and using the generated thermal image based on the temperature of the nozzle unit. The phenomenon of nozzle clogging may occur in a situation where a deposition material is deposited on the nozzle and the peripheral area of the nozzle as a temperature in a peripheral area of the nozzle is reduced. Therefore, in a method for inspecting a nozzle according to some example embodiments, when a surface temperature of the nozzle is lower than a reference temperature by using temperature information of a nozzle unit included in a thermal image of the nozzle unit generated by a thermal imaging camera, it may be determined that nozzle clogging has occurred in the nozzle. Therefore, it may be possible to determine whether or not a nozzle is clogged compared to a method for determining whether or not a nozzle is polluted by analyzing an optical image of a nozzle unit and recognizing or identifying pollutants, and thus, it may be possible to increase the inspection efficiency.

In addition, in a method for inspecting using a deposition apparatus according to some example embodiments of the present invention, when it is determined that nozzle clogging has occurred, the nozzle clogging may be removed by selectively transmitting energy to a nozzle where nozzle clogging has occurred. The energy may be transmitted by irradiating a laser beam. By selectively irradiating laser to a nozzle that needs repair, it may be possible to prevent or reduce problems such as denaturation of deposition materials and pressure increase in a crucible that may occur by controlling a temperature of a deposition source due to the unnecessary temperature of the deposition source.

The characteristics according to the example embodiments are not limited by the characteristics described above, and more various characteristics are included herein.

BRIEF DESCRIPTION OF THE DRAWINGS

The above and other aspects and features of example embodiments according to the present invention will become more apparent by describing in more detail example embodiments thereof with reference to the attached drawings, in which.

DETAILED DESCRIPTION

Aspects of some example embodiments of the present invention will now be described more fully hereinafter with reference to the accompanying drawings, in which example embodiments according to the present invention are shown. This invention may, however, be embodied in different forms and should not be construed as limited to the example embodiments set forth herein. Rather, these example embodiments are provided so that this disclosure will be more thorough and more complete, and will more fully convey the scope of embodiments according to the present invention to those skilled in the art.

It will also be understood that when a layer is referred to as being "on" another layer or substrate, it can be directly on the other layer or substrate, or intervening layers may also be present. In contrast, when an element is referred to as being "directly on" another element, there are no intervening elements present.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present invention. Similarly, the second element could also be termed the first element.

Hereinafter, aspects of some example embodiments will be described in more detail with reference to the accompanying drawings.

Figure 1:
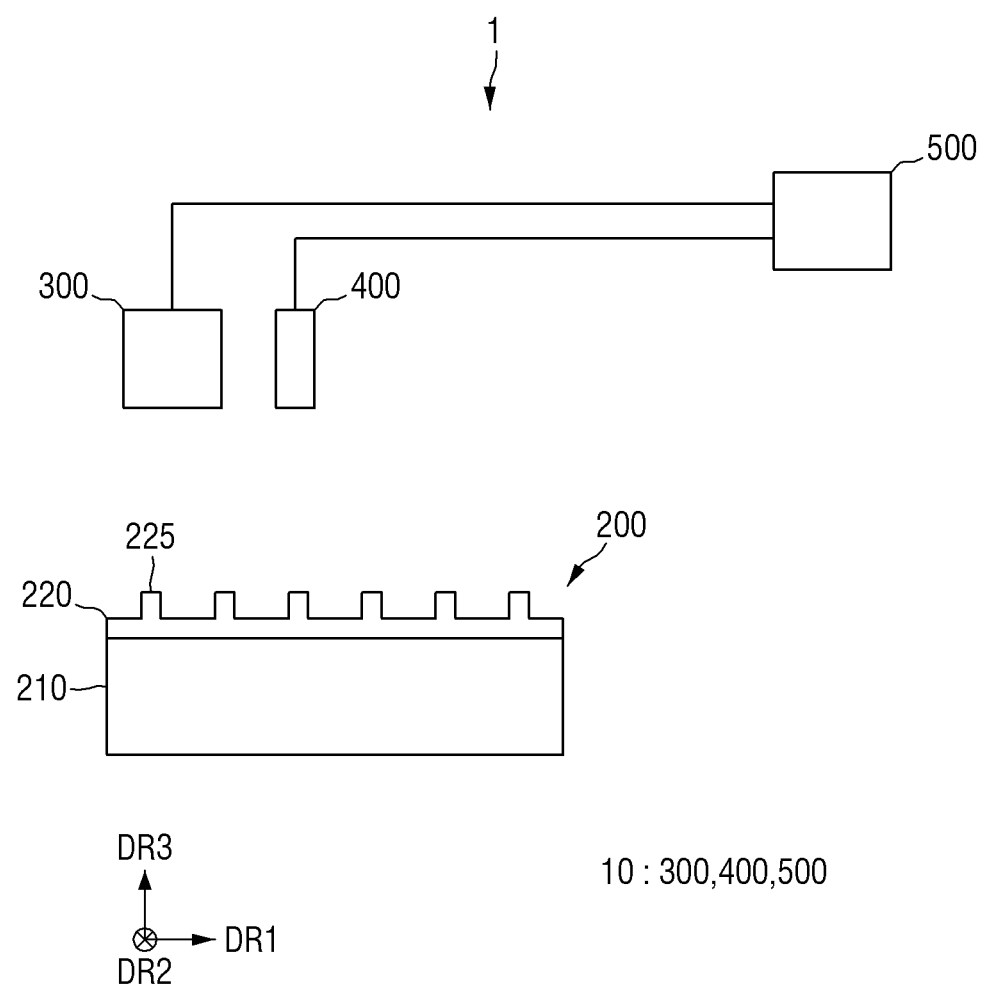
FIG. 1 is a schematic configuration view showing a deposition apparatus according to some example embodiments.

FIG. 1 is a schematic configuration view showing a deposition apparatus according to some example embodiments. Referring to FIG. 1, a deposition apparatus 1 according to some example embodiments may include a deposition source 200 including a plurality of nozzles 225 and a nozzle inspection unit 10.

The deposition source 200 may provide a deposition material. The deposition source 200 may be formed in a line shape extending in a direction (e.g., a first direction DR1) as a whole. The deposition source 200 may be a linear deposition source 200 in a line shape, but embodiments are not limited thereto.

The deposition source 200 may include a crucible 210 and a nozzle unit 220 including the plurality of nozzles 225.

The crucible 210 may be formed to be extended in a direction (e.g., a first direction DR1), which is an extension direction of the deposition source 200, and to have an open top. The crucible 210 may be formed in a shape corresponding to the deposition source 200. According to some example embodiments, when the deposition source 200 is a linear deposition source 200 having a line shape, the crucible 210 may have a line shape accordingly.

A deposition material may be positioned inside the crucible 210. The deposition material may include organic materials or inorganic materials. According to some example embodiments, the deposition material may be an organic material for an organic light emitting layer. For example, the deposition material may be a hole injection layer, a hole transport layer, an electron transport layer, or an organic material for an electron injection layer. However, embodiments are not limited thereto, and various materials may be applied as the deposition material. Furthermore, the crucible 210 may include a plurality of different organic materials.

A plurality of partition walls capable of separating an inner space of the crucible 210 may be installed inside the crucible 210 so that the deposition material is not biased and stored in a direction.

A high temperature may be formed inside the crucible 210. Therefore, the crucible 210 may be made of a material having a low thermal expansion coefficient at a high temperature. According to some example embodiments, the crucible 210 may be made of chromium (Cr), molybdenum (Mo), platinum (Pt), tungsten (W), or titanium (Ti). However, embodiments are not limited thereto, as long as a material has a low thermal expansion coefficient at high temperature.

The crucible 210 may have an open top. In other words, the crucible 210 may include a bottom and side walls.

A nozzle unit 220 may be seated on the open top of the crucible 210. The nozzle unit 220 may be arranged to cover the top of the crucible 210. The nozzle unit 220 may be seated on the top of the crucible 210 to shield an open portion of the crucible 210. However, embodiments are not limited thereto, and the nozzle unit 220 may be coupled to the crucible 210 and may shield the open portion of the crucible 210.

The nozzle unit 220 may include the plurality of nozzles 225. Each nozzle 225 may be spaced apart along a direction, which is an extension direction of the crucible 210.

Areas other than an area where the plurality of nozzles 225 are located in the nozzle unit 220 may be arranged in a form that covers the top of the crucible 210 to prevent or reduce instances of the deposition material leaking to the areas other than the area where the nozzle 225 is located. Accordingly, the deposition material inside the crucible 210 may move out of the crucible 210 through the nozzle 225.

The detailed description of a structure of the deposition source 200 will be described in more detail later.

The nozzle inspection unit 10 may include a temperature measurement unit 300, a repair unit 400, and a controller 500.

According to some example embodiments, the nozzle inspection unit 10 may inspect whether or not the nozzle 225 included in the nozzle unit 220 is clogged. For example, the nozzle inspection unit 10 may inspect whether or not the nozzle 225 is clogged by measuring a temperature of the nozzle unit 220.

The temperature measurement unit 300 may measure the temperature of the nozzle unit 220. The temperature measurement unit 300 may measure a temperature of each nozzle 225 or an adjacent area of an area where each nozzle 225 is located.

The temperature measurement unit 300 may include a temperature measurement device. The temperature measurement device is not limited as long as it is a device capable of measuring the temperature of the nozzle unit 220. For example, according to some example embodiments, the temperature measurement unit 300 may include a temperature sensor or a thermal imaging camera capable of sensing and/or measuring temperature.

When the temperature measurement unit 300 includes the temperature sensor, the temperature sensor may be arranged on each nozzle 225 to sense the temperature of each nozzle 225, or may be located in the adjacent area of each nozzle 225 to sense the temperature of each nozzle 225 and the adjacent area of the nozzle 225.

When the temperature measurement unit 300 includes the thermal imaging camera, the thermal imaging camera may measure a surface temperature of the nozzle unit 220 by photographing the nozzle unit 220. Hereinafter, a case where the temperature measurement unit 300 includes the thermal imaging camera will be described as an example. However, the embodiments are not limited to embodiments in which the temperature measurement unit 300 includes the thermal imaging camera. The temperature measurement unit 300 including the temperature measurement device and/or the temperature sensing device listed above or known in the art may be applied within a range sharing the technical idea.

A detailed description of embodiments in which the temperature measurement unit 300 includes the thermal imaging camera will be described later with reference to other drawings.

The temperature measurement unit 300 may measure the temperature of the nozzle unit 220 and transmit measurement data including measured temperature information of the nozzle unit 220 to the controller 500, which will be described later.

The controller 500 may determine whether or not the plurality of nozzles 225 included in the nozzle unit 220 is clogged based on the measurement data including the temperature information received from the temperature measurement unit 300. The controller 500 may determine whether or not each nozzle 225 included in the nozzle unit 220 is clogged by comparing the measurement data including the temperature information received from the temperature measurement unit 300 to a reference temperature (e.g., a set or predetermined reference temperature). When the temperature of the nozzle 225 is below the reference temperature, the controller 500 may determine that the nozzle 225 is clogged. A detailed description of how the controller 500 determines whether or not the nozzle 225 is clogged will be described in more detail later.

When it is determined that the nozzle 225 is clogged, the controller 500 may generate a control signal capable of controlling the repair unit 400. The controller 500 may transmit the control signal to the repair unit 400. The control signal may include location information of the nozzle 225 where nozzle clogging has occurred. The repair unit 400 may selectively remove the nozzle clogging by selectively providing energy to a specific nozzle 225 in which the nozzle clogging has occurred according to the control signal including the location information received from the controller 500. However, embodiments according to the present disclosure are not limited thereto. When it is determined from the controller 500 that the nozzle 225 is clogged, the repair unit 400 may provide the energy to the entire nozzle 225 included in the nozzle unit 220 to remove the nozzle clogging.

The repair unit 400 may include a member capable of providing the energy to the nozzle 225. The repair unit 400 may include a member that irradiates light having straightness. For example, the repair unit 400 may include a laser that irradiates a laser beam. When the repair unit 400 includes the laser, the nozzle clogging may be removed by selectively irradiating the laser beam to the specific nozzle 225 where the nozzle clogging has occurred according to the control signal received from the controller 500. However, embodiments are not limited thereto, and the repair unit 400 may include a member capable of controlling a temperature of an area adjacent to the nozzle 225. For example, the repair unit 400 may be arranged around the nozzle 225 and may include a heating unit capable of adjusting the temperature of the adjacent area of the nozzle 225. In this case, the nozzle clogging may be removed by controlling only a heating unit arranged adjacent to the specific nozzle 225 where the nozzle clogging has occurred according to the control signal received from the controller 500.

Figure 2:
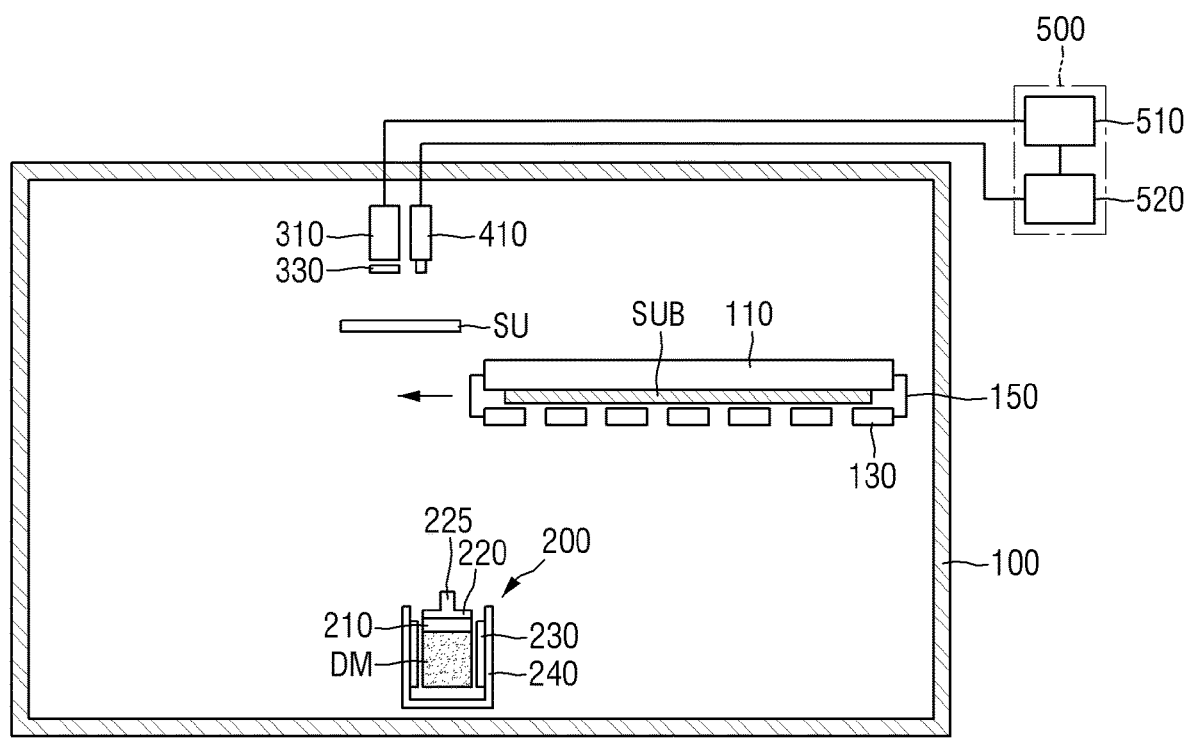
FIG. 2 is a schematic cross-sectional view of the deposition apparatus according to some example embodiments.
Figure 3:
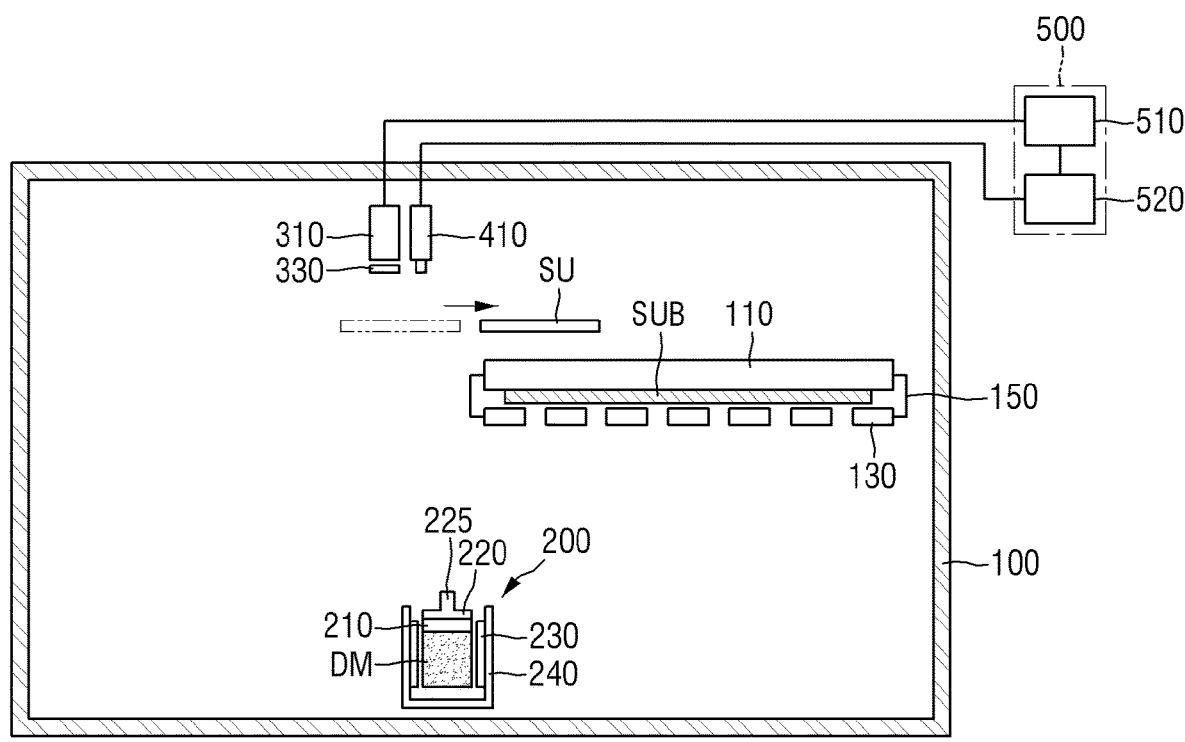
FIG. 3 is a schematic cross-sectional view for explaining an example in which a temperature measurement unit of the deposition apparatus of FIG. 2 measures a temperature of a nozzle unit.
Figure 3:
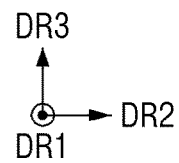
Figure 4:
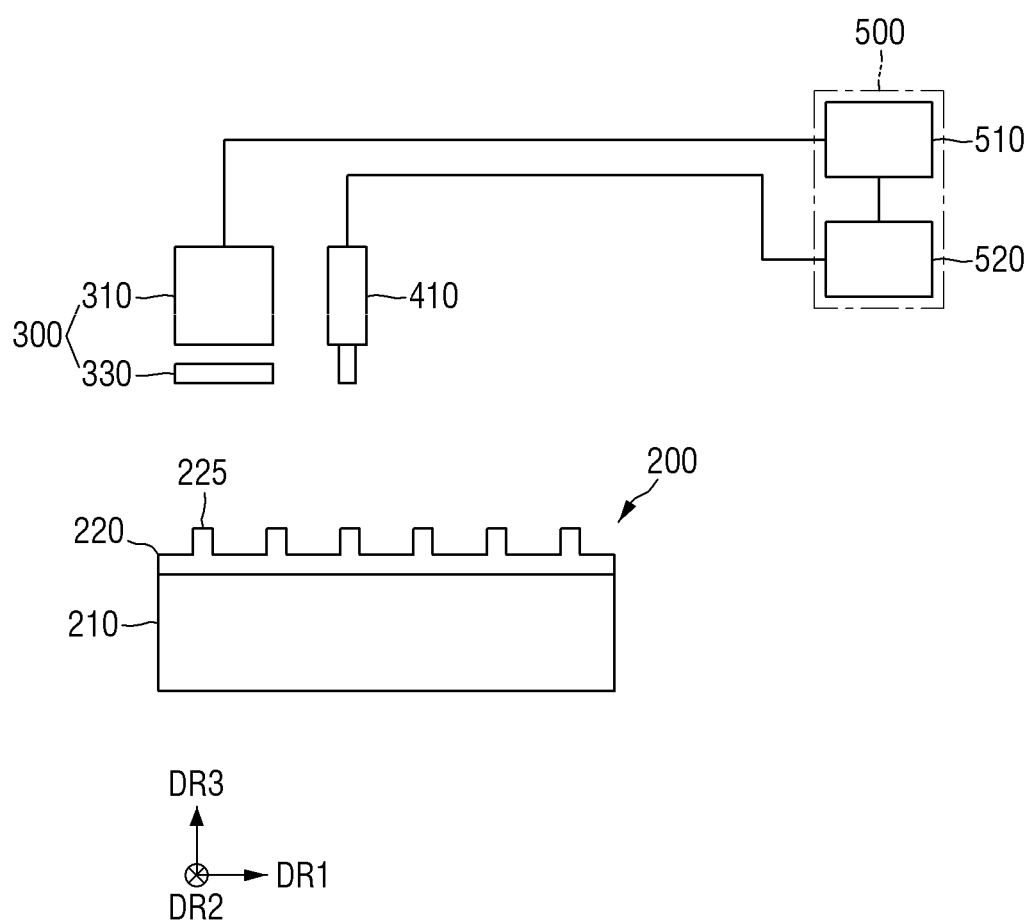
FIG. 4 is a cross-sectional view schematically showing a relationship between a nozzle inspection unit and a deposition source according to some example embodiments.

FIG. 2 is a schematic cross-sectional view of the deposition apparatus according to some example embodiments. FIG. 3 is a schematic cross-sectional view for explaining an example in which the temperature measurement unit of the deposition apparatus of FIG. 2 measures the temperature of the nozzle unit. FIG. 4 is a cross-sectional view schematically showing a relationship between the nozzle inspection unit and the deposition source according to some example embodiments.

Referring to FIGS. 2 to 4, the deposition apparatus 1 according to some example embodiments may include a chamber 100, the deposition source 200 including the plurality of nozzles 225, a substrate holder 110, a mask assembly 130, the temperature measurement unit 300, the repair unit 400, and the controller 500. The deposition apparatus 1 may further include a shutter SU.

The chamber 100 may provide a space for performing a deposition process, and an inside of the chamber 100 may be maintained in vacuum during the deposition process. Here, the vacuum may mean maintaining a pressure inside the chamber 100 in a low pressure state.

The chamber 100 may further include a carry-in/out port for carrying in/out of a substrate SUB, a vacuum pump to control the pressure inside the chamber 100 and to exhaust an evaporated material that is not deposited on the substrate SUB, and an exhaust port connected to the vacuum pump.

The substrate SUB may be an insulating substrate, a semiconductor substrate, or a display device substrate, but embodiments according to the present disclosure are not limited thereto. According to some example embodiments, the substrate SUB used in an organic light emitting display device will be described as an example.

A structure (e.g., a set or predetermined structure) may be formed on the substrate SUB through the deposition process. Depending on a manufacturing process of the organic light emitting display device, the structure formed on the substrate SUB through the deposition process may vary. For example, in the case of a hole injection layer forming process, a pixel defining layer and an anode electrode may be formed on the substrate SUB. In the case of an organic light emitting layer forming process, a hole injection layer and/or a hole transport layer may be formed on the substrate SUB, as well as the pixel defining layer and the anode electrode.

The substrate holder 110 and a fixing member 150 may be arranged inside the chamber 100. The substrate holder 110 may serve to seat the substrate SUB carried into the chamber 100. According to some example embodiments, the substrate holder 110 may be arranged on an upper side inside the chamber 100, and the substrate SUB may be seated on a lower side inside the chamber 100 facing the substrate holder 110.

The substrate holder 110 may include a magnetic material. For example, when the mask assembly 130 made of metal is used, because the substrate holder 110 has magnetism, the substrate holder 110 and the mask assembly 130 may be easily fixed. For example, the substrate holder 110 may be made of a material having a magnetic force, such as a magnet or an electromagnet.

In addition, the fixing member 150 may assist in fixing the substrate SUB. Furthermore, the fixing member 150 may assist in fixing the mask assembly 130, while maintaining a constant distance between the mask assembly 130 and the substrate SUB. The fixing member 150 may be formed of a detachable frame structure.

The mask assembly 130 may define an area in which the evaporated material from the deposition source 200 is deposited. The mask assembly 130 may include a mask 130a and a penetration portion 130b. The mask assembly 130 may further include a mask sidewall.

The mask 130a may cover the substrate SUB to prevent deposition of the evaporated material from the deposition source 200 in the corresponding area. The penetration portion 130b is an area where the substrate SUB is exposed, and a material evaporated from the deposition source 200 may be deposited on an area of the substrate SUB exposed by the penetration portion 130b. Therefore, the material evaporated from the deposition source 200 may form a pattern (e.g., a set or predetermined pattern) through the mask assembly 130 and be deposited on the substrate SUB. The mask sidewall may be positioned in an edge area of the mask assembly 130 and prevent the evaporated material from diffusing to areas other than the substrate SUB.

The mask assembly 130 may be a mask such as a fine metal mask (FMM) or may include a plurality of split masks, but embodiments according to the present disclosure are not limited thereto. The mask assembly 130 may be arranged close to the substrate SUB and fixed. A distance between the mask assembly 130 and the substrate SUB may be adjusted by the substrate holder 110 and the fixing member 150.

The deposition source 200 may provide a deposition material DM. The deposition source 200 may be positioned inside the chamber 100 and may be arranged to face the substrate SUB. According to some example embodiments, when the substrate holder 110 on which the substrate SUB is seated is arranged on the upper side of the inside of the chamber 100, the deposition source 200 may be arranged on the lower side of the inside of the chamber 100.

The deposition source 200 may be formed in a line shape extending in a first direction DR1 as described above, but embodiments are not limited thereto. A width of the deposition source 200 in the first direction DR1 may cover a width of the substrate SUB in the first direction DR1. Here, the width of the deposition source 200 covers the width of the substrate SUB means that the deposition source 200 covers all areas in which the deposition material DM is deposited on the substrate SUB in a width direction. Therefore, even if the deposition source 200 does not move in the first direction DR1, it is possible to cover all of the deposition areas positioned in the first direction DR1 of the substrate SUB.

The deposition source 200 may include the crucible 210, the nozzle unit 220 including the plurality of nozzles 225, the heater 230, and the first housing 240.

The first housing 240 may accommodate the crucible 210 and the heater 230.

The crucible 210 may be arranged inside the first housing 240, and the deposition material DM may be positioned inside the crucible 210. The deposition material DM may include an example of the deposition material as described above.

The heater 230 may be arranged close to an outer wall of the crucible 210. The heater 230 may be positioned a distance (e.g., a set or predetermined distance) apart from the sidewall of the crucible 210 and may serve to heat the crucible 210. The heater 230 may generate radiant heat and provide it to the crucible 210. The radiant heat provided from the heater 230 may evaporate the deposition material DM positioned inside the crucible 210.

According to some example embodiments, the heater 230 may be spaced apart from the outer wall of the crucible 210 and may be formed in a form surrounding the crucible 210. The heater 230 may be installed to be fixed to an inner wall of the first housing 240 or may be installed to be fixed between the first housing 240 and the crucible 210.

The deposition apparatus 1 may further include a transfer member. The transfer member may move the substrate holder 110, the mask assembly 130, and the substrate SUB fixed by the fixing member 150 in a second direction DR2 perpendicular to the first direction DR1, thereby enabling the deposition source 200 to cover the entire substrate SUB. However, embodiments according to the present disclosure are not limited thereto, and the transfer member may move the deposition source 200 in the second direction DR2. The deposition process may be performed while the substrate holder 110, the mask assembly 130, and the substrate SUB fixed by the fixing member 150 move in the second direction DR2 from a top of the deposition source 200.

The transfer member may include a driving motor for moving the deposition source 200, or the substrate holder 110, the mask assembly 130, and the substrate SUB fixed by the fixing member 150, and a guide rail for controlling a direction of movement. However, embodiments according to the present disclosure are not limited thereto, and the transfer member may be variously modified.

According to some example embodiments, the temperature measurement unit 300 may include a thermal imaging camera 310 that is spaced apart from the deposition source 200 and photographs the nozzle unit 220. The temperature measurement unit 300 may further include a protective cap 330 arranged between the thermal imaging camera 310 and the deposition source 200.

The thermal imaging camera 310 may be arranged above the nozzle unit 220 to photograph the nozzle unit 220. The thermal imaging camera 310 may be arranged to be spaced apart from the nozzle unit 220. The thermal image camera 310 may photograph the nozzle unit 220 to generate thermal image data of the nozzle unit 220. The thermal image data generated by the thermal image camera 310 may be a thermal image converted to represent a range of a specific value of an image of the surface temperature of the nozzle unit 220. The thermal image may be an image representing a designated color depending on surface temperature information of the nozzle unit 220. The thermal imaging camera 310 may output the thermal image data to the controller 500.

The repair unit 400 may include a laser 410 spaced apart from the deposition source 200 and irradiating a laser beam into a space inside the chamber 100. The laser beam irradiated from the laser 410 may enter the nozzle 225 through the space inside the chamber 100. In other words, the laser beam irradiated from the laser 410 may proceed toward the nozzle 225.

According to some example embodiments, the laser 410 may be arranged above the nozzle unit 220 including the nozzle 225. The laser 410 may be spaced apart from the nozzle unit 220. The laser 410 may irradiate the laser beam from a top of the nozzle unit 220 toward the nozzle 225 arranged at a bottom. However, the arrangement relationship between the laser 410 and the nozzle unit 220 embodiments are not limited thereto. For example, the laser 410 may be arranged to be spaced apart from a side of the nozzle unit 220, and the laser beam irradiated from the laser 410 may be indirectly irradiated toward the nozzle 225 through a separate member that provides a reflective surface. The laser beam irradiated from the laser 410 may enter the nozzle 225 to remove the deposition material and/or contaminants deposited on the nozzle 225 where the nozzle clogging has occurred. In other words, the laser 410 may serve to repair the clogged nozzle 225 by irradiating the laser beam toward the clogged nozzle 225. According to some example embodiments, the laser 410 may include a laser unit, a lens, a mirror, or a beam expander.

The controller 500 may determine whether or not the plurality of nozzles 225 are clogged based on the thermal image data received from the thermal imaging camera 310 and control the repair unit 400 to remove the nozzle clogging.

The controller 500 may include a determination unit 510 for determining whether or not the nozzle 225 is clogged, and a repair controller 520 for controlling the repair unit 400.

The thermal imaging camera 310 may output the thermal image data to the determination unit 510. The determination unit 510 may determine whether or not the nozzle 225 is clogged based on the thermal image data received from the thermal image camera 310.

According to some example embodiments, the determination unit 510 may process and analyze the thermal image data to calculate temperature data corresponding to each pixel, and use the calculated temperature data to detect a nozzle where the nozzle clogging has occurred. The determination unit 510 may compare the calculated temperature data with a previously stored reference temperature. When the surface temperature of the nozzle 225 calculated based on the thermal image data is below the reference temperature, the determination unit 510 may determine that the nozzle 225 is clogged.

According to some example embodiments, the determination unit 510 may process and analyze the thermal image data to distinguish the nozzle 225 where the nozzle clogging has occurred and the nozzle 225 where the nozzle clogging has not occurred through color difference between unit pixels. For example, when a color corresponding to a predetermined reference temperature or less is included in an area corresponding to the specific nozzle 225 in the thermal image data, the determination unit 510 may determine that the corresponding nozzle 225 is clogged.

When it is determined that the specific nozzle 225 is clogged based on the thermal image data, the determination unit 510 may transmit data including the location information of the nozzle 225 where the nozzle clogging has occurred to the repair controller 520.

The repair controller 520 may control the laser 410 according to the determination of whether or not the nozzle 225 is clogged. The repair controller 520 may apply a control signal to the laser 410 to irradiate the laser beam to the specific nozzle 225 where the nozzle clogging has occurred, based on the data including the location information of the specific nozzle 225 provided from the determination unit 510.

The laser 410 receiving the control signal from the repair controller 520 may irradiate the laser beam to the specific nozzle 225 where the nozzle clogging has occurred. When the laser beam is irradiated to the specific nozzle 225 where the nozzle clogging has occurred, the deposition material and/or the contaminants deposited in a peripheral area of the nozzle may receive energy from the laser beam and be vaporized, thereby eliminating the nozzle clogging.

The shutter SU may be arranged between the deposition source 200 and the thermal imaging camera 310 inside the chamber 100. The shutter SU may be arranged to overlap the deposition source 200 and the thermal imaging camera 310.

The shutter SU may serve to block the deposition material that evaporates during the deposition process from being deposited on the thermal imaging camera 310. The shutter SU may be shielded to block the thermal imaging camera 310 during the deposition process, and may be opened to allow the thermal imaging camera 310 to photograph the nozzle unit 220 during a process of inspecting whether or not the nozzle 225 is clogged.

Figure 5:
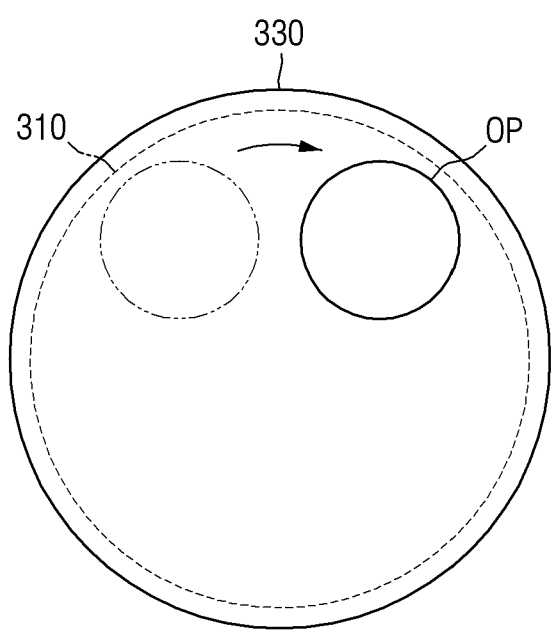
FIG. 5 is a plan view for explaining a thermal imaging camera and a protective cap according to some example embodiments.

FIG. 5 is a plan view for explaining the thermal imaging camera and a protective cap according to some example embodiments.

Referring to FIGS. 2 and 5, the protective cap 330 may be arranged between the thermal imaging camera 310 and the deposition source 200. In addition, the protective cap 330 may be arranged between the thermal imaging camera 310 and the shutter SU.

The protective cap 330 may serve to protect the thermal imaging camera 310. Also, the protective cap 330 may be arranged to overlap a lens included in the thermal imaging camera 310. The protective cap 330 may include a lens opening OP exposing a part of the lens of the thermal imaging camera 310.

The protective cap 330 may serve to replace a contaminated lens of the thermal image camera 310. When a portion of the lens of the thermal imaging camera 310 is contaminated by the evaporation material, the protective cap 330 may rotate such that an uncontaminated lens area is exposed by the lens opening OP. By rotating the protective cap 330 to replace the lens, it is possible to save time for replacing the lens.

Hereinafter, a method for inspecting whether or not a nozzle is clogged using the deposition apparatus according to some example embodiments will be described with reference to FIGS. 6 to 8.

Figure 6:
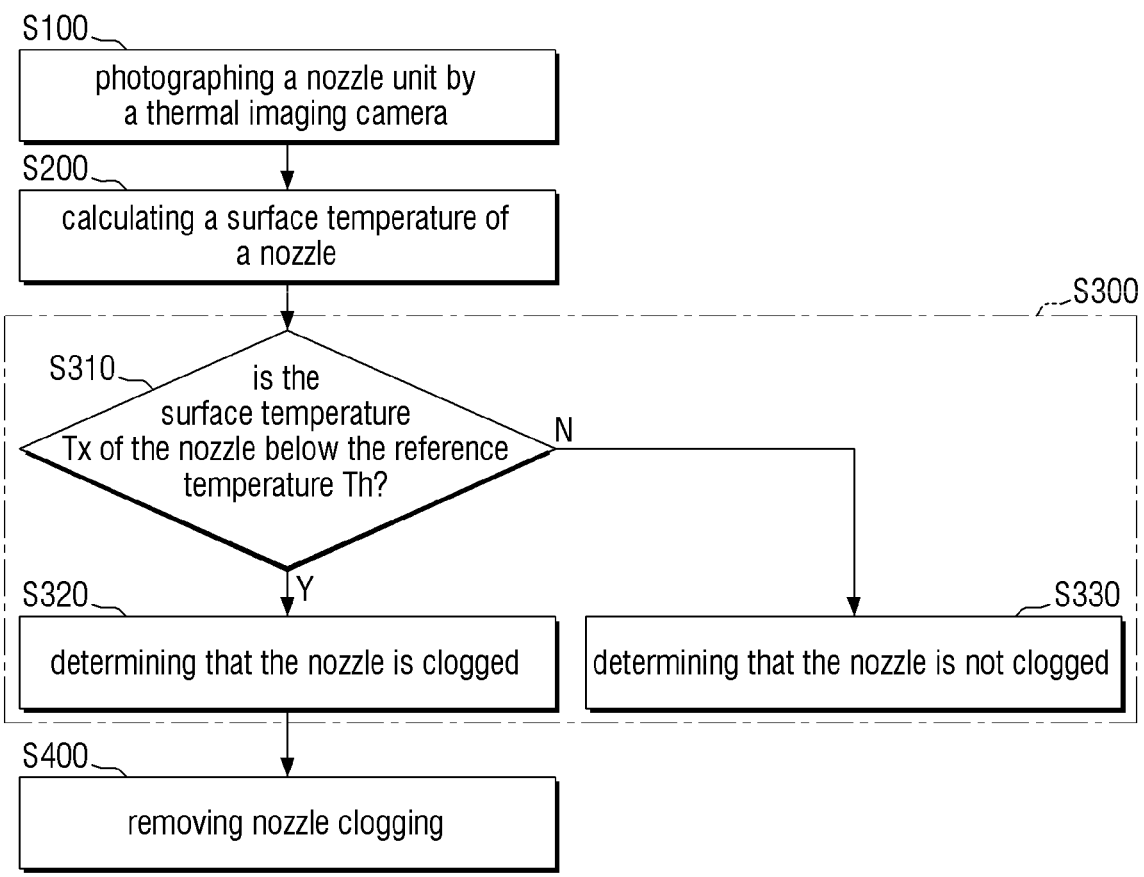
FIG. 6 is a flowchart showing an example of the method for inspecting the nozzle using the deposition apparatus according to some example embodiments.

FIG. 6 is a flowchart showing an example of the method for inspecting the nozzle using the deposition apparatus according to some example embodiments. FIG. 7 is an example of the thermal image of the nozzle based on the thermal image data. FIG. 8 is a cross-sectional view for explaining step S400.

Referring to FIG. 6, the method for inspecting the nozzle in the deposition apparatus according to some example embodiments includes generating thermal image data by photographing a nozzle unit with a thermal camera (S100), calculating a surface temperature of a nozzle through the thermal image data (S200), determining whether or not the nozzle is clogged (S300), and removing nozzle clogging when it is determined that the nozzle is clogged (S400).

Figure 9:
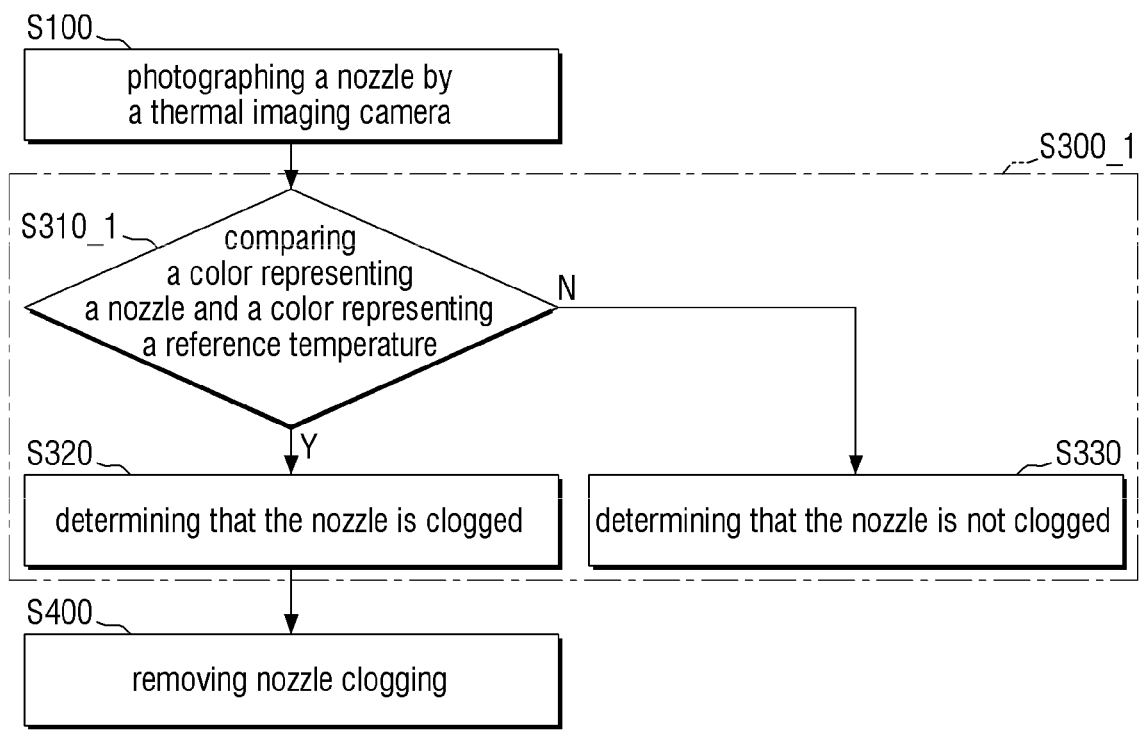
FIG. 9 is a flowchart showing another example of the method for inspecting the nozzle using the deposition apparatus according to some example embodiments.

First, the thermal imaging camera photographs the nozzle unit to generate the thermal image data (S100 of FIG. 9).

Referring to FIGS. 1, 2, and 6 to 8, in order to inspect whether or not the nozzle 225 is clogged, the thermal imaging camera 310 arranged above the nozzle unit 220 may photograph the nozzle unit 220 to generate the thermal image data. The thermal imaging camera 310 may be arranged above the nozzle unit 220 in the inner space of the chamber 100, and may photograph toward a lower portion where the nozzle unit 220 is arranged in the inner space of the chamber 100. The thermal imaging camera 310 may photograph one surface of the nozzle unit 220 in which the plurality of nozzles 225 are arranged.

The nozzle unit 220 photographed by the thermal imaging camera 310 may be an entire area of the nozzle unit 220 including the plurality of nozzles 225, but embodiments are not limited thereto. The area of the nozzle unit 220 photographed by the thermal imaging camera 310 may be a partial area of the nozzle unit 220 in which at least one nozzle 225 of the plurality of nozzles 225 is arranged, as illustrated in FIG. 7. For example, the partial area of the nozzle unit 220 photographed by the thermal imaging camera 310 may be an area in which a second nozzle 225b arranged to be spaced apart and adjacent to a first nozzle 225a in the first direction DR1 is arranged.

Figure 7:
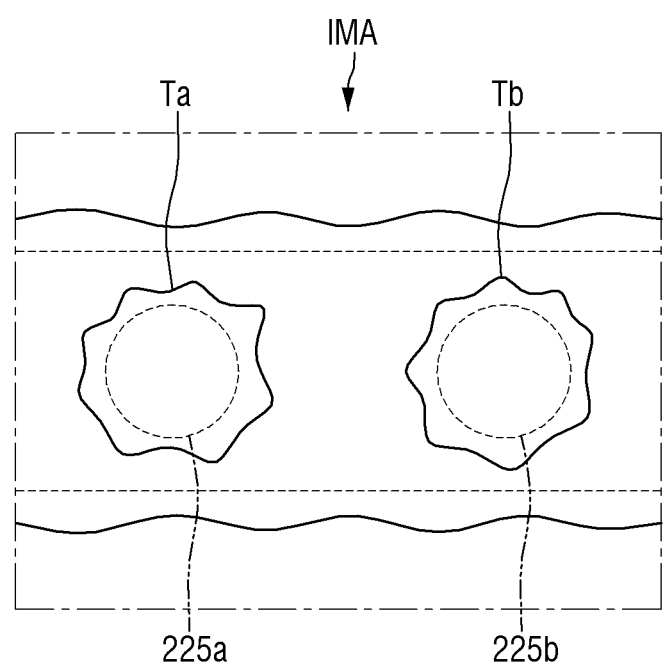
FIG. 7 is an example of a thermal image of a nozzle based on thermal image data.

The thermal image data generated by the thermal image camera 310 may be a thermal image IMA converted to represent a specific range of values of an image of the surface temperature of the nozzle unit 220 as shown in FIG. 7. The thermal imaging camera 310 may sense the surface temperature of the nozzle unit 220 photographed by the thermal imaging camera 310. The thermal image camera 310 may generate the thermal image data representing a designated color depending on the surface temperature information of the nozzle unit 220 sensed by the thermal image camera 310. The thermal image camera 310 may generate the thermal image IMA of the nozzle unit 220 as shown in FIG. 7 based on the thermal image data including the surface temperature information of the nozzle unit 220.

Second, the surface temperature of the nozzle is calculated through the thermal image data (S200 of FIG. 6).

The determination unit 510 may process and analyze the thermal image data received from the thermal image camera 310 to calculate temperature data corresponding to pixels included in the thermal image data. The temperature data may include a surface temperature Tx of an area corresponding to the nozzle 225 photographed by the thermal imaging camera 310. The determination unit 510 may calculate the surface temperature Tx of each nozzle 225 through pre-stored temperature data corresponding to pixels.

The determination unit 510 may calculate temperature data corresponding to pixels included in an area corresponding to each nozzle from the thermal image IMA to calculate the surface temperature Tx of each nozzle 225. Referring to FIG. 7, the determination unit 510 may calculate temperature data corresponding to a pixel representing the first nozzle 225a in the thermal image IMA to calculate a first surface temperature Ta of the first nozzle 225a. Similarly, the determination unit 510 may calculate temperature data corresponding to a pixel representing the second nozzle 225b from the thermal image data IMA to calculate a second surface temperature Tb of the second nozzle 225b.

Third, it is determined whether or not the nozzle is clogged (S300 of FIG. 6).

According to some example embodiments, determining whether or not the nozzle is clogged (S300) may include comparing the surface temperature Tx of the nozzle 225 and a reference temperature Th (S310 of FIG. 6).

The determination unit 510 may compare the surface temperature Tx of each nozzle 225 calculated from the thermal image IMA and the predetermined reference temperature Th. For example, the determination unit 510 may compare the first surface temperature Ta of the first nozzle 225a and the reference temperature Th. Similarly, the determination unit 510 may compare the second surface temperature Tb of the second nozzle 225b and the reference temperature Th. For example, the calculated first surface temperature Ta may be smaller than the reference temperature Th, and the calculated second surface temperature Tb may be larger than the reference temperature Th.

Subsequently, when the surface temperature of the specific nozzle is included in a range below the reference temperature, the determination unit 510 determines that the specific nozzle is clogged (S320 of FIG. 6).

For example, when the surface temperature Tx of the first nozzle 225a is the first surface temperature Ta, the first surface temperature Ta is included in the range below the reference temperature Th, and thus, the determination unit 510 may determine that the first nozzle 225a is clogged.

Further, when the surface temperature of the specific nozzle is included in a range exceeding the reference temperature (or is not included in the range below the reference temperature), the determination unit 510 determines that the specific nozzle is not clogged (S330 of FIG. 6).

For example, when the surface temperature Tx of the second nozzle 225b is the second surface temperature Tb, the second surface temperature Tb is greater than the reference temperature Th, and thus, the determination unit 510 may determine that the second nozzle 225b is not clogged.

Fourth, when it is determined that the specific nozzle is clogged, the nozzle clogging is removed (S400 of FIG. 6).

Figure 8:
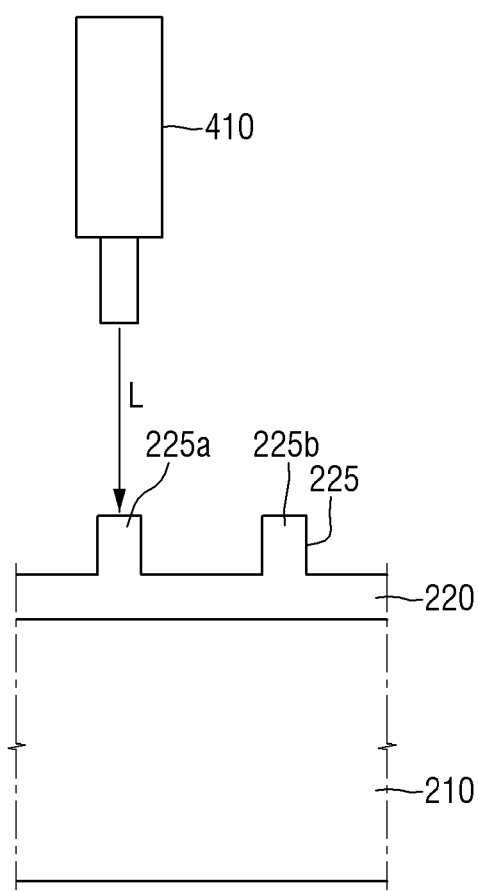
FIG. 8 is a cross-sectional view for explaining step S400.

Referring to FIGS. 7 and 8, when it is determined that the specific nozzle 225 is clogged, the laser 410 may remove the nozzle clogging by irradiating a laser beam L to the specific nozzle 225 where the nozzle clogging has occurred.

For example, when it is determined that the first nozzle 225a is clogged, the determination unit 510 may transmit data including location information of the first nozzle 225a to the repair controller 520. The repair controller 520 may apply a control signal to the laser 410 to irradiate the laser beam L to the first nozzle 225a based on the data including the location information of the first nozzle 225a received from the determination unit 510. The laser 410 received the control signal from the repair controller 520 may irradiate the laser beam L toward the first nozzle 225a. The laser beam L irradiated from the laser 410 may remove deposition materials and/or contaminants deposited in the first nozzle 225a and/or a peripheral area of the first nozzle 225a.

As such, according to the method for inspecting whether or not the nozzle is clogged using a deposition apparatus according to some example embodiments of the present invention, it is possible to determine whether or not the nozzle is clogged by measuring a temperature of a nozzle unit using a thermal imaging camera and using the generated thermal image based on the temperature of the nozzle unit. The phenomenon of nozzle clogging may occur in a case where a deposition material is deposited on the nozzle and a peripheral area of the nozzle as a temperature in the peripheral area of the nozzle is reduced. Therefore, according to the method for inspecting the nozzle according to some example embodiments, when a surface temperature of a nozzle is lower than a reference temperature by using temperature information of a nozzle unit included in a thermal image of the nozzle unit generated by a thermal imaging camera, it may be determined that nozzle clogging has occurred in the nozzle. Therefore, it is possible to intuitively determine whether or not a nozzle is clogged compared to a method for determining whether or not a nozzle is polluted by analyzing an optical image of a nozzle unit and recognizing pollutants, and thus, it is possible to increase the inspection efficiency.

In addition, according to a method for inspecting using a deposition apparatus according to some example embodiments of the present invention, when it is determined that nozzle clogging has occurred, the nozzle clogging may be removed by selectively transmitting energy to a nozzle where nozzle clogging has occurred. The energy may be transmitted by irradiating a laser beam. By selectively irradiating laser to a nozzle that needs repair, it is possible to prevent problems such as denaturation of deposition materials and pressure increase in a crucible that may occur by controlling a temperature of the deposition source 200 due to the unnecessary temperature of the deposition source 200.

Hereinafter, a method for inspecting whether or not a nozzle is clogged using a deposition apparatus according to some example embodiments will be described in more detail. In the following, the same configuration or steps as the already described embodiments will be briefly described, and the differences will be mainly described.

Figure 10:
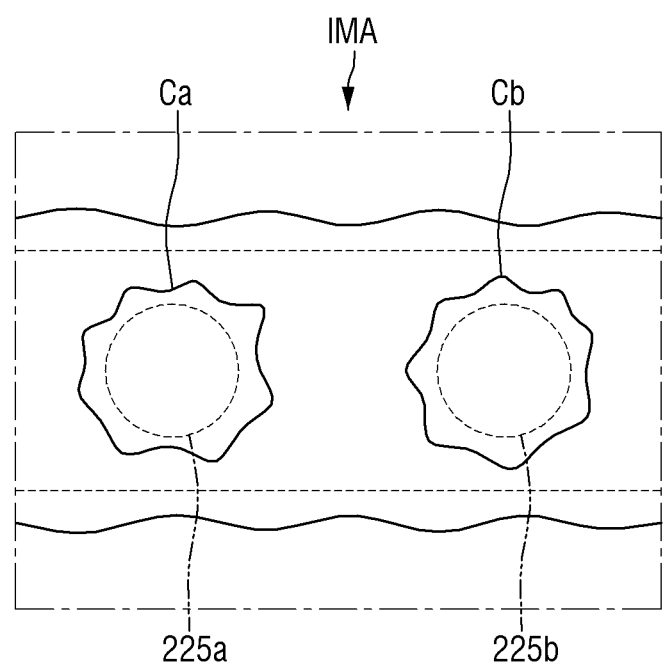
FIG. 10 is another example of the thermal image of the nozzle based on the thermal image data.

FIG. 9 is a flowchart showing another example of the method for inspecting the nozzle using the deposition apparatus according to some example embodiments. FIG. 10 is another example of the thermal image of the nozzle based on the thermal image data.

Referring to FIGS. 9 and 10, the method for inspecting the nozzle in the deposition apparatus according to some example embodiments includes generating thermal image data by photographing a nozzle unit with a thermal camera (S100), determining whether or not the nozzle is clogged (S300_1), and removing nozzle clogging when it is determined that the nozzle is clogged (S400).

First, the thermal imaging camera photographs the nozzle unit to generate the thermal image data (S100 of FIG. 9).

The thermal image camera 310 may generate the thermal image data representing a designated color depending on the surface temperature information of the nozzle unit 220 sensed by the thermal image camera 310. The thermal image data generated by the thermal camera 310 may be a thermal image IMA representing the designated color depending on the surface temperature information of the nozzle unit 220 as shown in FIG. 10.

Second, it is determined whether or not the nozzle is clogged (S300_1 of FIG. 9).

The determination unit 510 may process and analyze the thermal image data received from the thermal imaging camera 310 to distinguish the nozzle 225 where the nozzle clogging has occurred and the nozzle 225 where the nozzle clogging has not occurred through color difference between unit pixels.

According to some example embodiments, determining whether or not the nozzle is clogged (S300_1) may include comparing a color representing a specific nozzle from the thermal image data and a color representing a reference temperature (S310_1 of FIG. 9).

Referring to FIGS. 9 and 10, the determination unit 510 may compare a color of an area corresponding to the nozzle 225 photographed by the thermal imaging camera 310 and the reference temperature based on the thermal image data received from the thermal camera 310.

The determination unit 510 may compare a color representing each nozzle 225 calculated from the thermal image IMA and a color representing a predetermined reference temperature. For example, referring to FIG. 10, the determination unit 510 may compare a first color Ca included in a pixel representing the first nozzle 225a in the thermal image IMA and the color representing the reference temperature. Similarly, the determination unit 510 may compare a second color Cb included in a pixel representing the second nozzle 225b in the thermal image data IMA and the color representing the reference temperature. The first color Ca representing the first nozzle 225a may include a color representing a temperature lower than the reference temperature, and the second color Cb representing the second nozzle 225b may be a color representing a temperature higher than the reference temperature. A color representing a low temperature may be generally blue, and a color representing a high temperature may be red, but embodiments are not limited thereto. However, embodiments are not limited thereto, and it may be modified depending on the color representing the reference temperature.

When a color corresponding to a predetermined reference temperature or less is included in an area corresponding to the specific nozzle 225 in the thermal image data, the determination unit 510 may determine that the corresponding nozzle 225 is clogged (S320 of FIG. 9).

For example, the color representing the first nozzle 225a is the first color Ca, and the first color Ca is included in the color representing the reference temperature or less. Therefore, the determination unit 510 may determine that the first nozzle 225a is clogged.

When a color corresponding to a predetermined reference temperature or less is not included in the area corresponding to the specific nozzle 225 in the thermal image data, the determination unit 510 may determine that the corresponding nozzle 225 is not clogged (S330 of FIG. 9).

For example, the color representing the second nozzle 225b is the second color Cb, and the second color Cb is not included in the color representing the reference temperature or less. Therefore, the determination unit 510 may determine that the second nozzle 225b is not clogged.

Hereinafter, other embodiments of the deposition apparatus will be described. In the following embodiments, the same configuration as the already described embodiments will be omitted or simplified, and the differences will be mainly described.

Figure 11:
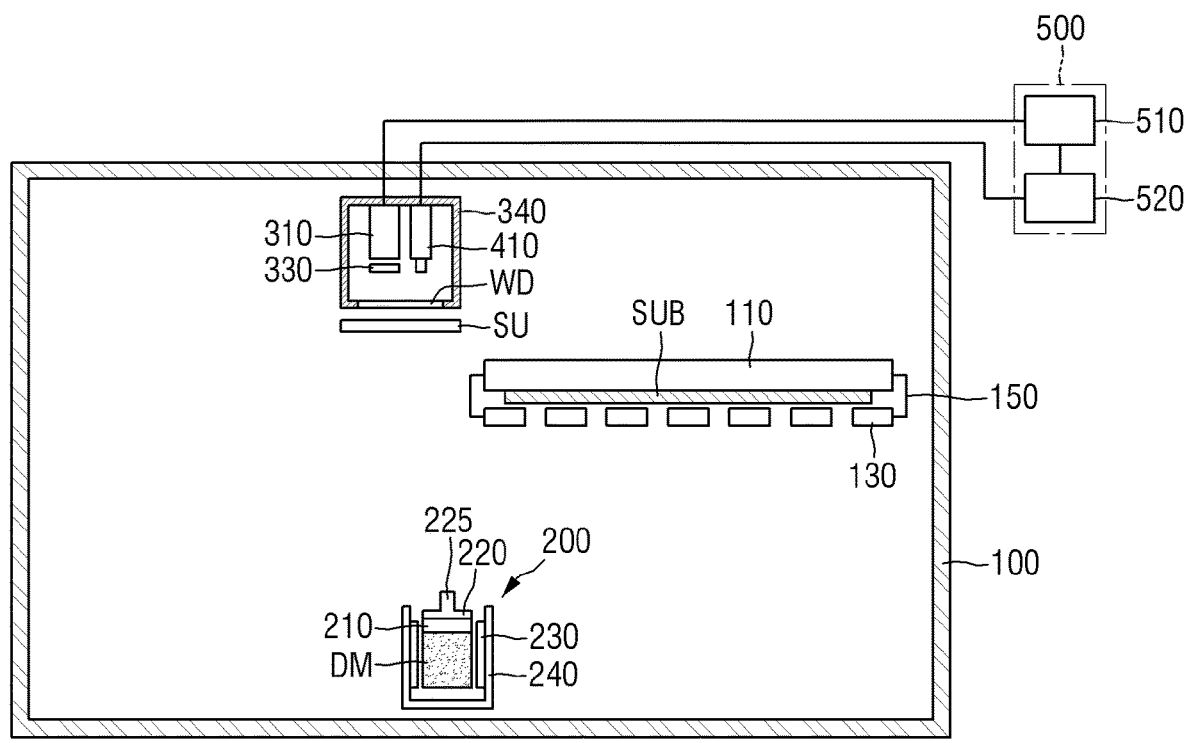
FIG. 11 is a schematic cross-sectional view of a deposition apparatus according to some example embodiments.
Figure 11:
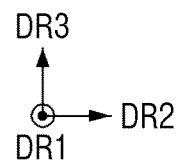
Figure 12:
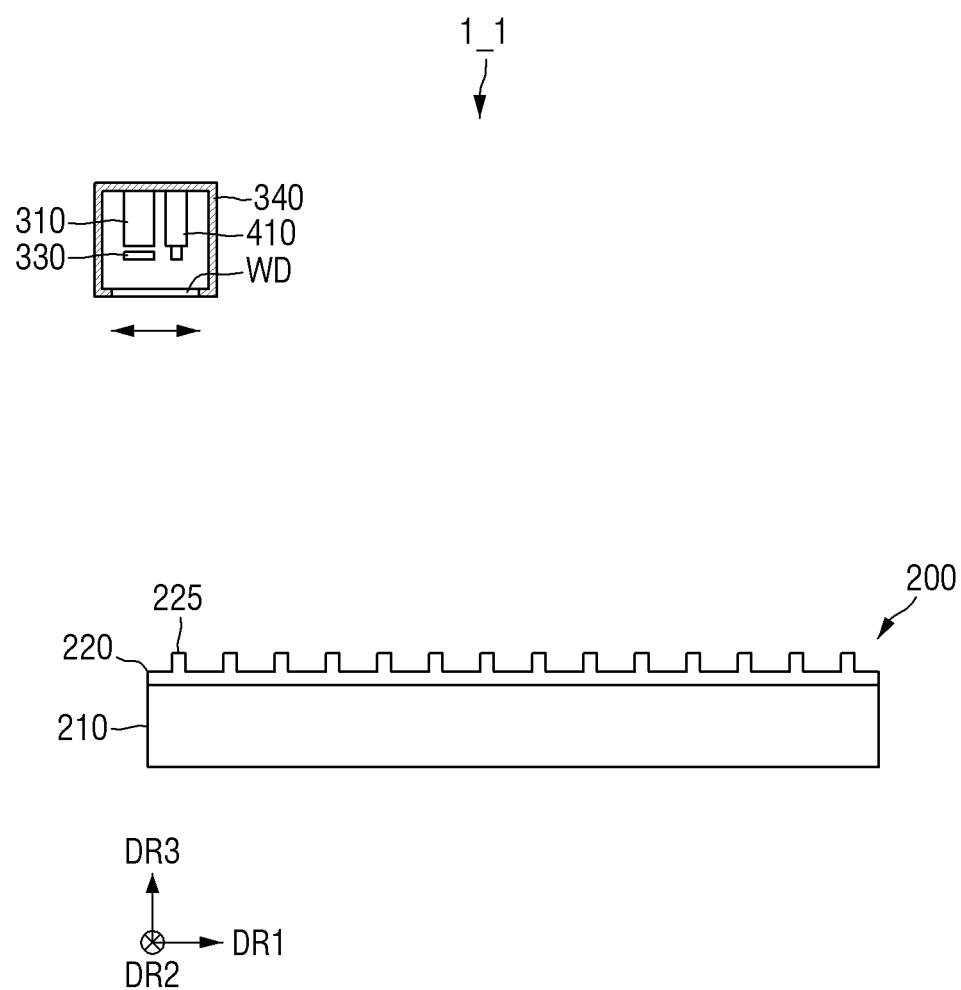
FIG. 12 is a schematic side view of the deposition apparatus according to the embodiment of FIG. 11.

FIG. 11 is a schematic cross-sectional view of a deposition apparatus according to some example embodiments. FIG. 12 is a schematic side view of the deposition apparatus according to some example embodiments of FIG. 11.

Referring to FIGS. 11 and 12, a deposition apparatus 1_1 according to some example embodiments may include a second housing 340 accommodating the thermal imaging camera 310 and the laser 410, a protection window WD, a moving member for moving the second housing 340.

The second housing 340 may be arranged above the deposition source 200 in the chamber 100. Also, the second housing 340 may be arranged above the substrate holder 110. The second housing 340 may be arranged to overlap the deposition source 200.

An inside of the second housing 340 may be maintained at atmospheric pressure. Because the inside of the chamber 100 is maintained in a vacuum, the second housing 340 have a structure that is closed to an outside of the second housing 340.

The protection window WD may be arranged on a bottom surface of the second housing 340. The protection window WD may be arranged on a front surface of the second housing 340 facing the deposition source 200. The protection window WD may be arranged to photograph the nozzle unit 220 using the thermal imaging camera 310 and to overlap an area to remove nozzle clogging by using the laser 410.

The protection window WD may be made of a transparent material that enables the laser beam emitted from the laser 410 and proceeds to the nozzle unit 220 to penetrate. The laser beam emitted from the laser 410 arranged inside the second housing 340 may penetrate the protection window WD and enter the chamber 100. The protection window WD may be made of quartz.

The protection window WD may be arranged between the thermal imaging camera 310 and the nozzle unit 220. In addition, the protection window WD may be arranged between the laser 410 and the nozzle unit 220. The protection window WD may be arranged to overlap the thermal imaging camera 310, the laser 410, and the deposition source 200.

The protection window WD may have a rectangular planar shape. In addition, the protection window WD may have a circular planar shape, but embodiments are not limited thereto.

The protection window WD may allow the laser beam to penetrate, and at the same time, may prevent the lens of the laser 410 from being contaminated from the deposition material on the lens of the laser 410 as the deposition process is performed. Accordingly, it is possible to prevent a decrease in refraction or penetration ratio due to deposition of the deposition material on the laser 410, thereby improving processing quality.

The protection window WD may also prevent the lens of the thermal imaging camera 310 from being contaminated from the deposition material. FIGS. 11 and 12 show that the protection window WD is fixed to the bottom surface of the second housing 340, but embodiments are not limited thereto. With a separate moving member, the protection window WD may be opened while the thermal imaging camera 310 photographs the nozzle unit 220, and may be shielded while the laser 410 is in a process of removing the nozzle clogging and/or during the deposition process.

The moving member may serve to move the second housing 340. The moving member may reciprocate the second housing 340 along a direction that is an extension direction of the crucible 210. The second housing 340 accommodating the thermal imaging camera 310 and the laser 410 reciprocates by the moving member, and thus, the thermal imaging camera 310 and the laser 410 above the nozzle unit 220 may inspect whether or not the nozzle is clogged for each area of the nozzle unit 220 and remove the nozzle clogging.

Figure 13:
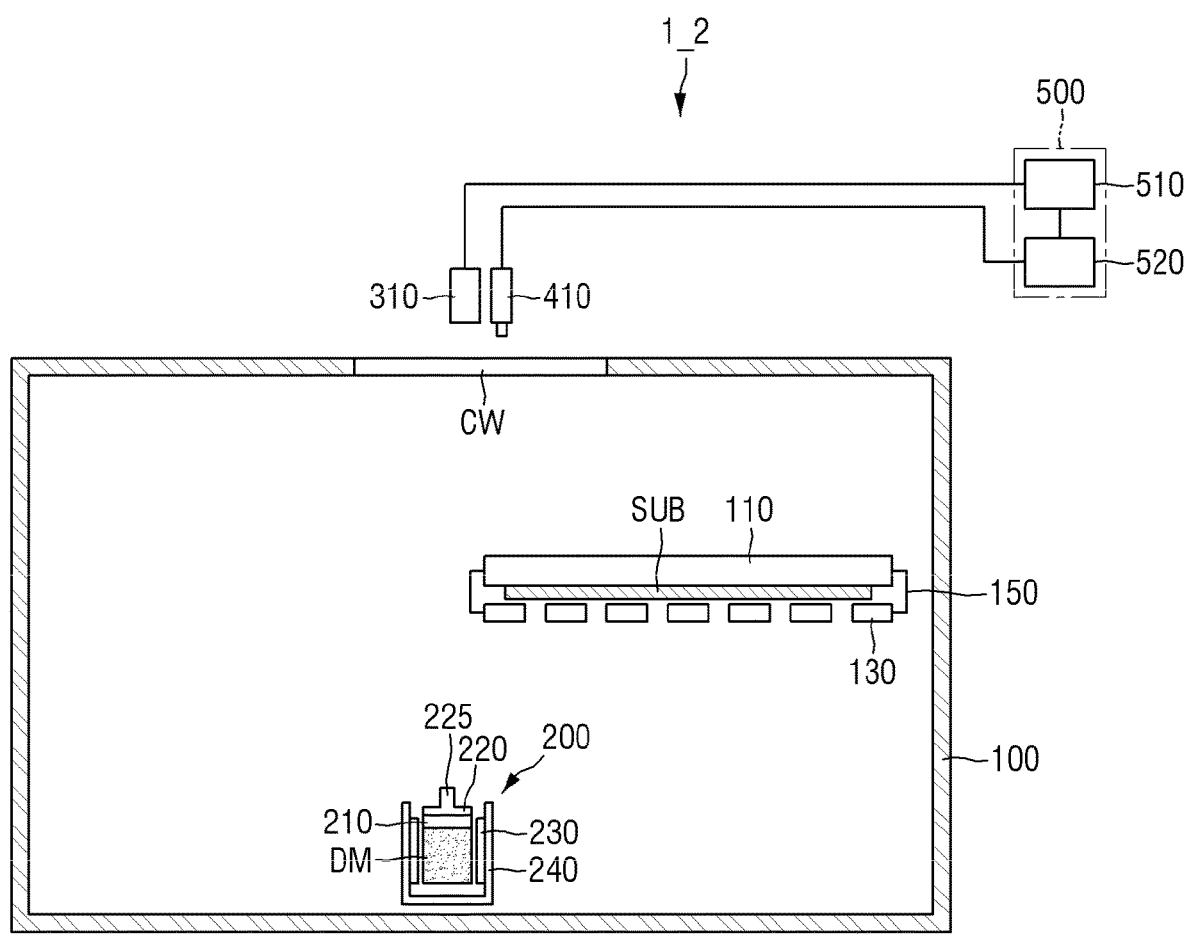
FIG. 13 is a schematic cross-sectional view of a deposition apparatus according to some example embodiments.

FIG. 13 is a schematic cross-sectional view of a deposition apparatus according to some example embodiments. The embodiment shown in FIG. 13 differs from the embodiment shown in FIG. 2 in that the thermal imaging camera 310 and the laser 410 are arranged outside the chamber 100.

Referring to FIG. 13, the thermal imaging camera 310 and the laser 410 of a deposition apparatus 1_2 according to some example embodiments may be arranged outside the chamber 100. The thermal imaging camera 310 and the laser 410 may be arranged above the deposition source 200 to overlap the deposition source 200.

A chamber window CW may be arranged on a ceiling surface of the chamber 100. The chamber window CW may be arranged between the thermal imaging camera 310 and the laser 410 and the deposition source 200. In other words, the chamber window CW may be arranged to overlap the thermal imaging camera 310 and the laser 410 and the deposition source 200.

The chamber window CW may be made of a transparent material that enables the laser beam emitted from the laser 410 to penetrate. The laser beam emitted from the laser 410 arranged outside the chamber 100 may enter the chamber 100 through the chamber window CW.

Figure 14:
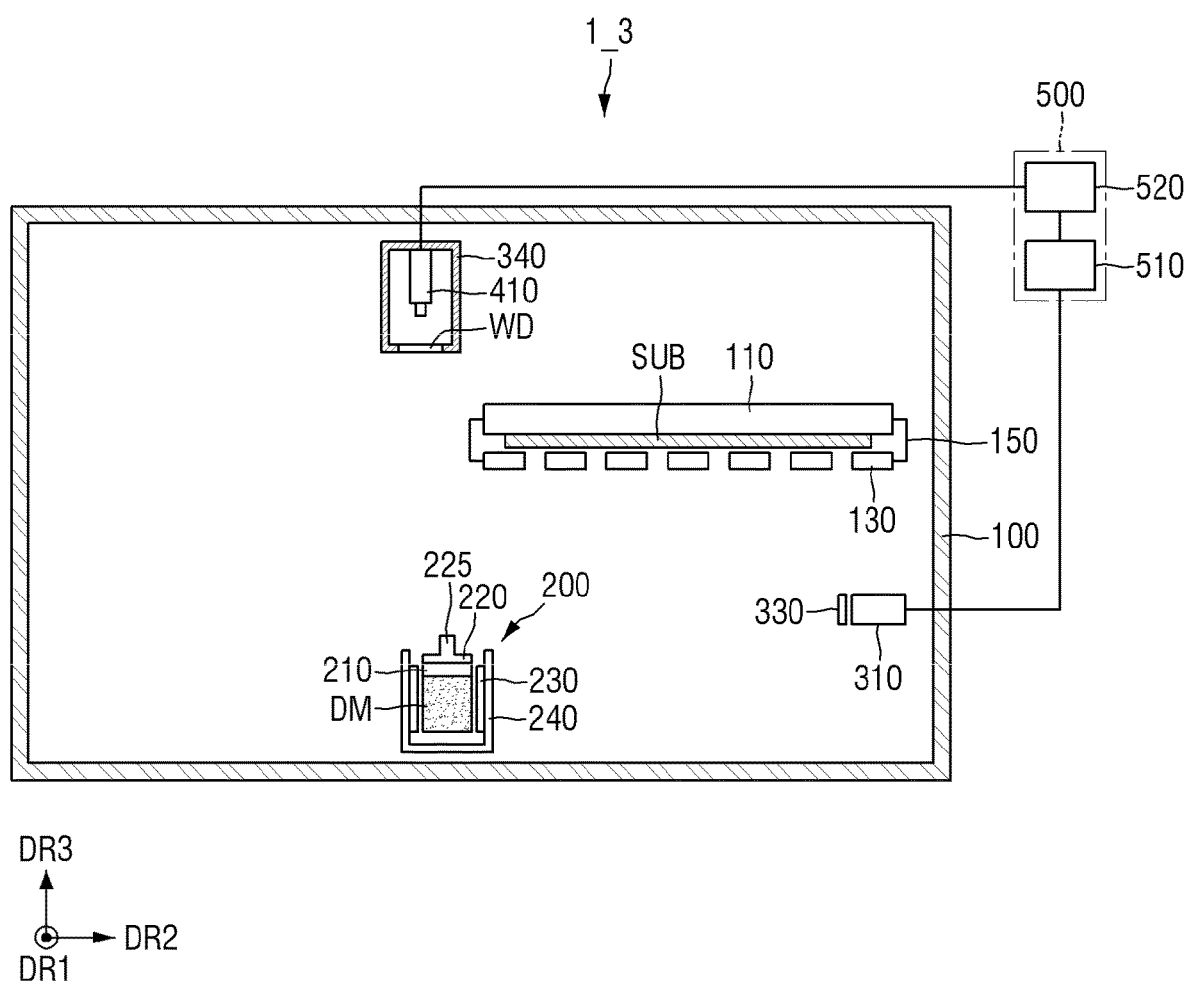
FIG. 14 is a schematic cross-sectional view of a deposition apparatus according to some example embodiments.

The chamber window (CW) may be made of quartz. FIG. 14 shows a case where the chamber window CW is formed of one window, but embodiments are not limited thereto. In other words, the chamber window CW may be formed of a plurality of windows depending on the number of the lasers 410 and positions in which they are arranged.

The chamber window CW may have a rectangular planar shape. In addition, the chamber window CW may have a circular planar shape, but embodiments are not limited thereto.

FIG. 14 is a schematic cross-sectional view of a deposition apparatus according to some example embodiments.

FIG. 14 is a schematic cross-sectional view of a deposition apparatus according to some example embodiments. The embodiment as shown in FIG. 14 differs from the embodiment as shown in FIG. 12 in that the thermal imaging camera 310 is arranged on a side of the nozzle unit 220 inside the chamber 100.

Referring to FIG. 14, the thermal imaging camera 310 of a deposition apparatus 1_3 according to some example embodiments may be arranged on a side of the deposition source 200 inside the chamber 100. For example, the thermal imaging camera 310 may be arranged to be spaced apart from each other in the second direction DR2 crossing the first direction DR1 which is the extending direction of the crucible 210 from the deposition source 200. The thermal imaging camera 310 may be arranged to overlap the nozzle unit 220 in the second direction DR2 to photograph the plurality of nozzles 225 of the nozzle unit 220.

According to some example embodiments, by arranging the thermal imaging camera 310 on the side of the deposition source 200, a lens included in the thermal imaging camera 310 may be prevented from being contaminated by a deposition material vaporized and moved upward.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

In concluding the detailed description, those skilled in the art will appreciate that many variations and modifications can be made to the example embodiments without substantially departing from the principles of embodiments according to the present invention. Therefore, the disclosed example embodiments of the invention are used in a generic and descriptive sense only and not for purposes of limitation.

What is claimed is:

1. A method for inspecting a first nozzle and a second nozzle, comprising: measuring, by a temperature measurement unit, a temperature of the first nozzle and the second nozzle; receiving, by a controller, temperature measurement data corresponding to the temperature of the first nozzle and the second nozzle; comparing, by the controller, the temperature of the first nozzle with a reference temperature; determining, by the controller, the first nozzle is clogged based on the temperature of the first nozzle; and transmitting, by the controller, a control signal to a repair unit, based on the temperature of the first nozzle, to control an operation of repairing the first nozzle.

2. The method of claim 1, wherein determining the first nozzle is clogged comprises determining that the first nozzle is clogged in response to the temperature of the first nozzle being below the reference temperature.

3. The method of claim 2, further comprising:
removing nozzle clogging of the first nozzle in response to determining that the first nozzle is clogged.

4. The method of claim 3, wherein in removing the nozzle clogging, a laser beam is irradiated to the first nozzle using a laser.

5. The method of claim 1, further comprising determining that the second nozzle is not clogged in response to the temperature of the second nozzle not being below the reference temperature.

6. A method for inspecting a nozzle, comprising:
photographing, by a thermal imaging camera, the nozzle to generate thermal image data including temperature information of the nozzle;
receiving, by a controller, the thermal image data corresponding to the nozzle;
determining, by the controller, the nozzle is clogged based on the thermal image data corresponding to the nozzle; and
transmitting, by the controller, a control signal to a repair unit, based on the thermal image data corresponding to the nozzle, to control an operation of repairing the nozzle.

7. The method of claim 6, wherein determining the nozzle is clogged comprises comparing a color representing the nozzle from the thermal image data and a color representing a reference temperature.

8. The method of claim 7, wherein determining the nozzle is clogged further comprises determining that the nozzle is clogged in response to the color representing the nozzle being a color representing a temperature below the reference temperature.

9. The method of claim 6, wherein determining the nozzle is clogged further comprises:
calculating a temperature of the nozzle from the thermal image data; and
comparing the calculated temperature of the nozzle and a reference temperature.

10. The method of claim 9, wherein determining the nozzle is clogged further comprises determining that the nozzle is clogged in response to the calculated temperature of the nozzle being below the reference temperature.

11. The method of claim 6, further comprising: removing, by the repair unit, nozzle clogging of the nozzle in response to determining the nozzle is clogged.

12. A deposition apparatus, comprising: a deposition source including a plurality of nozzles arranged along a direction; a temperature measurement unit configured to measure a temperature of a nozzle from among the plurality of nozzles and to generate temperature measurement data corresponding to the temperature of the nozzle; a controller configured to receive the temperature measurement data corresponding to the temperature of the nozzle and to determine whether or not the nozzle is clogged based on the temperature measurement data received from the temperature measurement unit; and a repair unit configured to receive a control signal based on the temperature of the nozzle to execute a repairing operation of the nozzle.

13. The apparatus of claim 12, wherein the temperature measurement unit comprises a thermal imaging camera configured to photograph the nozzle to generate thermal image data, wherein the thermal imaging camera is spaced apart from the nozzle.

14. The apparatus of claim 13, wherein the controller is configured to calculate the temperature of the nozzle from the thermal image data, and to compare the calculated temperature of the nozzle with a reference temperature to determine the nozzle is clogged.

15. The apparatus of claim 14, wherein the controller is configured to determine that the nozzle is clogged based on the calculated temperature of the nozzle being below the reference temperature.

16. The apparatus of claim 13, wherein the controller is configured to calculate a color representing the nozzle from the thermal image data, and to compare the color representing the nozzle with a color representing a reference temperature to determine the nozzle is clogged.

17. The apparatus of claim 16, wherein the controller is configured to determine that the nozzle is clogged based on the color representing the nozzle being a color representing a temperature below the reference temperature.

18. The apparatus of claim 13, further comprising:
the repair unit including a laser spaced apart from the nozzle.

19. The apparatus of claim 13, wherein the temperature measurement unit further comprises a protective cap between the thermal imaging camera and the deposition source.

20. The apparatus of claim 12, further comprising:
a mask assembly above the deposition source and including a penetration portion and a mask.

* * * * *